US007853023B2

(12) United States Patent
Kim

(10) Patent No.: US 7,853,023 B2
(45) Date of Patent: Dec. 14, 2010

(54) METHOD AND APPARATUS TO REPRODUCE EXPANDED SOUND USING MONO SPEAKER

(75) Inventor: Sun-min Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1108 days.

(21) Appl. No.: 11/530,557

(22) Filed: Sep. 11, 2006

(65) Prior Publication Data

US 2007/0121951 A1 May 31, 2007

(30) Foreign Application Priority Data

Nov. 30, 2005 (KR) ...................... 10-2005-0115847

(51) Int. Cl.
*H03G 3/00* (2006.01)
*H04R 1/10* (2006.01)

(52) U.S. Cl. ........................................... 381/63; 381/74

(58) Field of Classification Search ................... 384/63, 384/61, 17, 18, 74
See application file for complete search history.

(56) References Cited

U.S. PATENT DOCUMENTS 5,497,425 A 3/1996 Rapoport
5,555,306 A 9/1996 Gerzon
2005/0129248 A1 6/2005 Kraemer et al.

FOREIGN PATENT DOCUMENTS

| | | |
|---|---|---|
| KR | 137182 | 2/1998 |
| KR | 1998-31979 | 7/1998 |
| KR | 2001-57764 | 7/2001 |
| KR | 2004-48104 | 6/2004 |
| KR | 2005-43985 | 5/2005 |
| KR | 2005-60552 | 6/2005 |
| KR | 2005-61808 | 6/2005 |
| KR | 2005-63613 | 6/2005 |
| KR | 2005-75029 | 7/2005 |
| WO | 0178486 | 10/2001 |

OTHER PUBLICATIONS

International Search Report dated Feb. 21, 2007 issued in PCT International Application PCT/KR2006/005029.
European Search Report issued Mar. 4, 2009 in EP Application No. 06823737.9
Korean Office Action dated Sep. 29, 2006 issued in KR 2005-115847.

*Primary Examiner*—Ping Lee
(74) *Attorney, Agent, or Firm*—Stanzione & Kim, LLP

(57) ABSTRACT

A method and apparatus to reproduce sound using a mono speaker, and a stereo sound system employing the same. The sound reproducing method can include: adding a first channel signal and a second channel signal of an input stereo signal or an input mono signal; sound field filtering by adding a sound field effect to the added signals; convolving the signal of the first channel with a first HRTF in a first convolution process; convolving the signal of the second channel with a second HRTF in a second convolution process; and adding the signal output from the sound field filtering and the signals output from the first and second convolution processes to produce an output signal.

21 Claims, 6 Drawing Sheets

METHOD AND APPARATUS TO REPRODUCE EXPANDED SOUND USING MONO SPEAKER

CROSS-REFERENCE TO RELATED APPLICATIONS

This application claims the benefit of Korean Patent Application No. 10-2005-0115847, filed on Nov. 30, 2005, in the Korean Intellectual Property Office, the disclosure of which is incorporated herein in its entirety by reference.

BACKGROUND OF THE INVENTION

1. Field of the Invention

The present general inventive concept relates to a stereo sound generation system, and more particularly, to a method and apparatus to reproduce an expanded sound using a mono speaker and a stereo sound generation system employing the sound reproducing apparatus.

2. Description of the Related Art

Generally, a mono speaker is used to reproduce a stereo sound or a mono sound as an expanded sound.

Japanese Patent Publication No. 2004-104296, registered on Sep. 6, 2002, discloses such a sound reproducing apparatus for a mono speaker sound.

FIG. 1 illustrates a conventional expanded sound reproducing apparatus. Referring to FIG. 1, first and second buffers 3 and 4 of the expanded sound reproducing apparatus control the signal level of two channels L and R. A subtractor 5 subtracts the signals of the first and second channels output from the first and second buffers 3 and 4. A low-pass filter 6 (LPF) passes only a low frequency band with respect to the difference signal output from the subtractor 5. A third buffer 7 controls the level of the signal output from the LPF 6. An adder 8 adds the signal output from the third buffer 7 and the signals of the first and second channels. A fourth buffer 9 controls the level of the signal output from the adder 8.

Accordingly, the sound reproducing apparatus of FIG. 1 extracts only the low frequency band signals with respect to the difference signal between the two channels and adds the input signals of the two channels.

However, the conventional sound reproducing apparatus of FIG. 1 only controls the frequency band, and thus the sound diffuseness is not intensive. Moreover, the sound diffuseness with respect to the mono signal is remarkably low.

SUMMARY OF THE INVENTION

The present general inventive concept provides a method and apparatus to reproduce an expanded sound in which, when an input stereo sound signal or an input mono sound signal is reproduced with one speaker, a monaural head related transfer function (HRTF) is used to generate a virtual sound source with respect to the sound image in upper and lower directions and a source width is diffused using an early reflection sound with respect to the sound image in right and left directions.

The present general inventive concept also provides a stereo sound reproducing apparatus to reproduce an input stereo sound or a mono signal as a diffused sound using a mono speaker.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept are achieved by providing a method of reproducing an input stereo signal or an input mono signal as an expanded sound using a mono speaker, the method including adding the first channel signal and the second channel signal, sound field filtering in which a sound field effect is added to the added signals of first and second channels, convolving the signal of the first channel with a first HRTF in a first convolution process, convolving the signal of the second channel with a second HRTF in a second convolution process, and adding the signal output from the sound field filtering and the signals output from the first and second convolution processes to produce an output signal.

The foregoing and/or other aspects and utilities of the present general inventive concept are also achieved by providing a method of reproducing a stereo or a mono input signal as an expanded sound using a mono speaker, the method including adding the first channel and the second channel signal, sound field filtering in which a sound field effect is added to the added signals, adding the signal output from the sound field filtering and the signals of the first and second channels to produce an output signal, and convolving the output with a monaural HRTF.

The foregoing and/or other aspects and utilities of the present general inventive concept are achieved by providing a sound reproducing apparatus reproducing an input stereo signal or an input mono signal as an expanded sound using a mono speaker, the apparatus comprising: a first adding unit adding signals of first and second channels; a sound field filter unit applying a sound field effect with respect to the added signals of the first adding unit; a first convolution unit convolving the signal of the first channel with a first monaural HRTF; a second convolution unit convolving the signal of the second channel with a second monaural HRTF; a second adding unit adding the signal output from the sound field filter unit and the signals output from the first and second convolution units to produce an output signal; and a spectral shaping unit changing a frequency characteristic of the output signal.

The foregoing and/or other aspects and utilities of the present general inventive concept are achieved by providing a method of reproducing an input stereo signal or an input mono signal as an expanded sound using a mono speaker, the method including adding a first channel signal and a second channel signal, providing a horizontal expansion effect to the added first and second channel signals, providing a vertical expansion effect to each of the first and second channel signals, and adding the signals having the horizontal expansion effect and the vertical expansion effect to provide signals vertically and horizontally expanded.

The foregoing and/or other aspects and utilities of the present general inventive concept are achieved by providing a sound reproducing apparatus to reproduce an input stereo signal or an input mono signal as an expanded sound using a mono speaker, the apparatus including a first adding unit to add signals of first and second channels, a sound field filter unit to apply a sound field effect with respect to the added signals of the first adding unit, a convolution device to convolve the first channels signals with a first monaural HRTF and the second channel signals with a second monaural HRTF, and a second adding unit to add the signal output from the sound field filter unit and the convolved first and second channel signals output from the convolution device to produce an output signal.

The foregoing and/or other aspects and utilities of the present general inventive concept are achieved by providing a recordable medium containing a method of reproducing an input stereo signal or an input mono signal as an expanded sound using a mono speaker, the method including adding a first channel signal and a second channel signal, sound field filtering by adding a sound field effect to the added channel signals, convolving the signal of the first channel with a first HRTF in a first convolution process, convolving the signal of the second channel with a second HRTF in a second convolution process, and adding the signal output from the sound field filtering and the signals output from the first and second convolution processes to produce an output signal.

The foregoing and/or other aspects and utilities of the present general inventive concept are achieved by providing a recordable medium containing a method of reproducing an input stereo signal or an input mono signal as an expanded sound using a mono speaker, the method including adding a first channel signal and a second channel signal, sound field filtering by adding a sound field effect to the added channel signals, convolving the signal of the first channel with a first HRTF in a first convolution process, convolving the signal of the second channel with a second HRTF in a second convolution process, and adding the signal output from the sound field filtering and the signals output from the first and second convolution processes to produce an output signal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
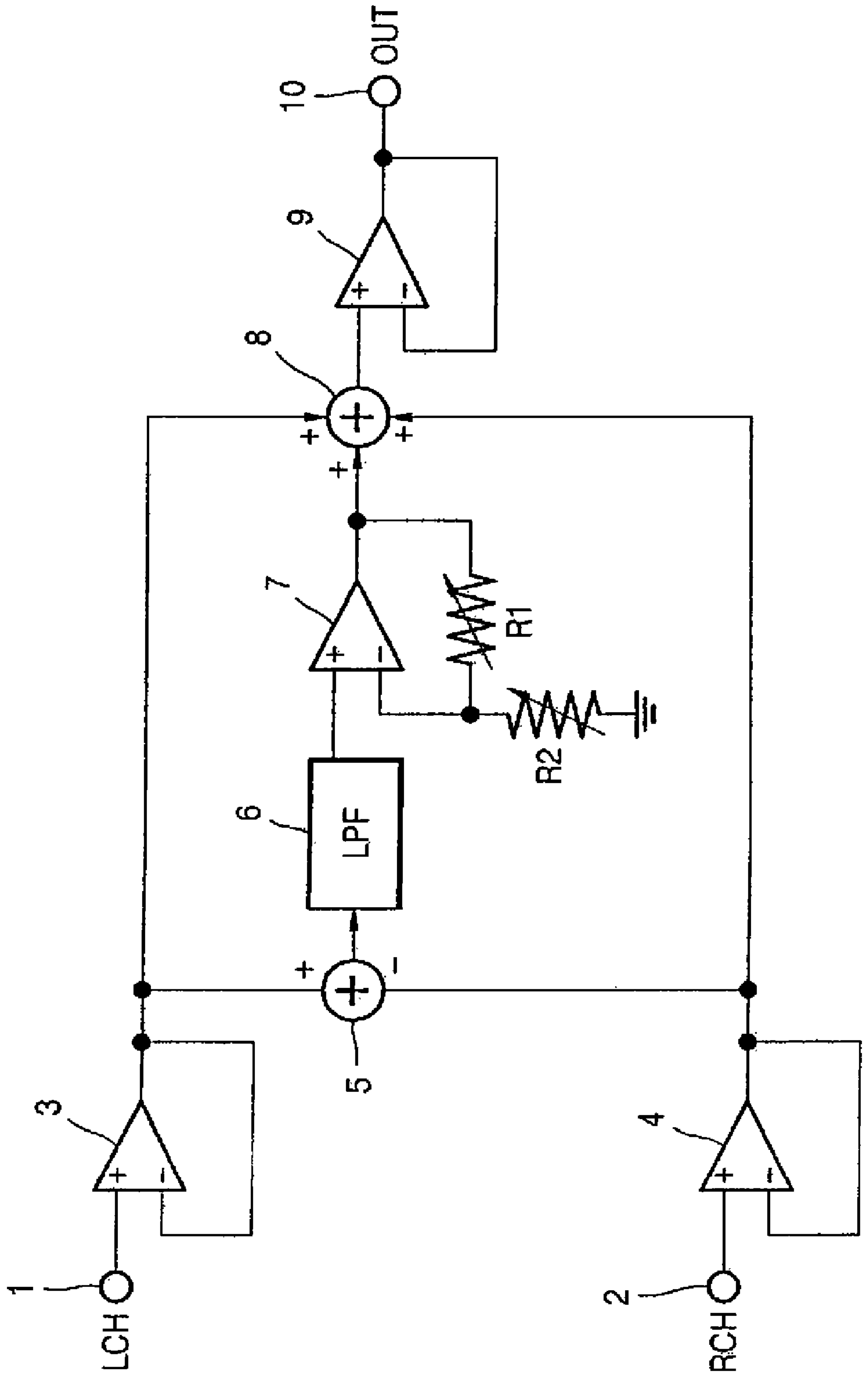
FIG. 1 (PRIOR ART)
FIG. 1 illustrates a conventional expanded sound reproducing apparatus.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

A head related transfer function (HRTF) contains information indicating the characteristic of a space in which a sound has travelled through, such as a time difference between two ears, a level difference between two ears, and the shape of pinnas. When an input signal is convolved with a HRTF at a specific position, the audience hears the sound at a specific position. Accordingly, when an input sound stereo signal or an input mono sound signal is reproduced by a mono speaker, the source width of the input signals of the two channels is diffused in upper and lower directions using monaural HRTFs which respectively correspond to an upper elevation and a lower elevation, and a sound field effect such as an early reflection sound with respect to the added signals of the two channels is revived, and thus the source width of the signals is diffused in right and left directions.

Figure 2A:
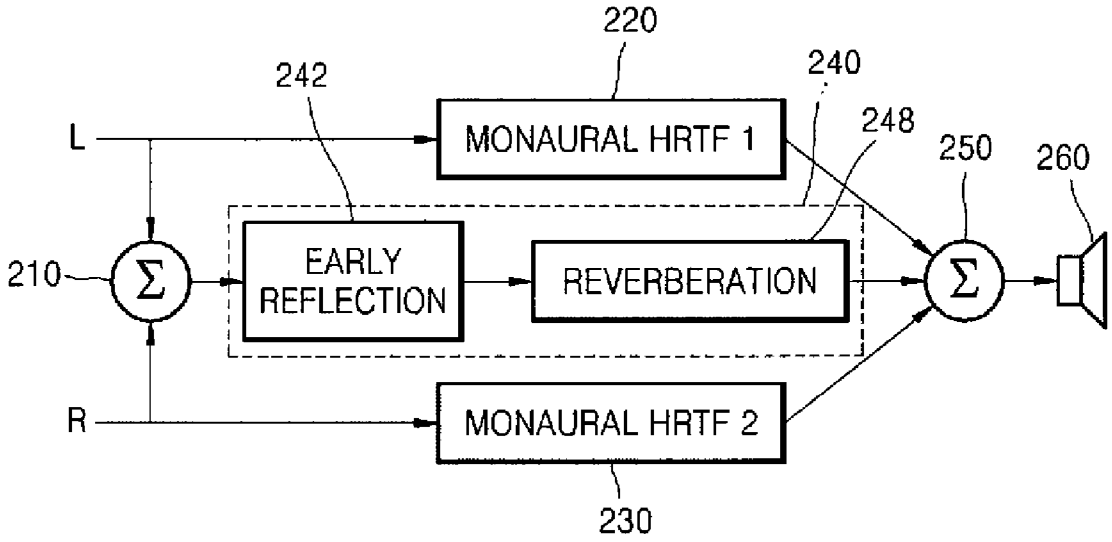
FIG. 2A illustrates an expanded sound reproducing apparatus using a mono speaker according to an embodiment of the present general inventive concept.

FIG. 2A illustrates an expanded sound reproducing apparatus using a mono speaker according to an embodiment of the present general inventive concept.

The sound reproducing apparatus of FIG. 2A includes a first adding unit 210, a first convolution unit 220, a second convolution unit 230, a sound field filter unit 240, a second adding unit 250, and a mono speaker 260.

Referring to FIG. 2A, the first adding unit 210 adds audio signals of a left channel L and a right channel R.

The sound field filter unit 240 adds a sound field effect such as an early reflection sound or a reverberation sound in order to give a horizontal expansion effect to a signal output by the first adding unit 210. That is, the sound field filter unit 240 can include an early reflection generator 242 and a reverberation generator 248. The early reflection generator 242 is formed of finite impulse filter coefficients and generates an early reflection sound using a well-known technique such as a tapped delay line. The reverberation generator 248 generates reverberation using a well-known technique such as a comb filter or an all-pass filter.

The first and second convolution units 220 and 230 convolve signals of each channel using a monaural HRTF in order to give a vertical expansion effect to each of the signals of the left channel L and the right channel R. That is, the HRTF on a median plane is equally applied to both ears. Accordingly, the position of elevation of the sound image can be changed only by the mono speaker. Thus for a signal of a left channel L, a monaural HRTF 1 which corresponds to the upper angle is applied and for a signal of a right channel R, a monaural HRTF 2 which corresponds to the lower angle is applied to diffuse the source width of the speaker in upper and lower directions.

The second adding unit 250 adds the signals output from the sound field filter unit 240 and the signals output from the first and second convolution units 220 and 230 and outputs them to the mono speaker 260.

Accordingly, the mono speaker 260 finally reproduces signals that are vertically and horizontally expanded and thus provides the audience with a diffused sound effect.

Figure 2B:
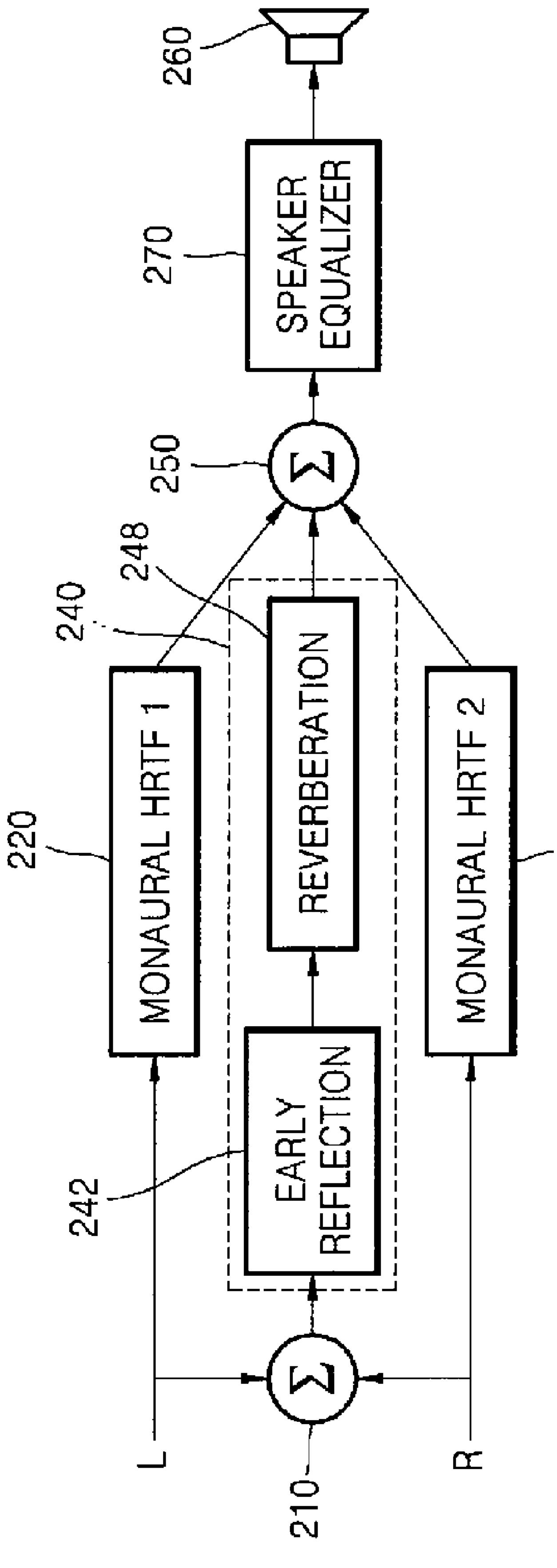
FIG. 2B illustrates an expanded sound reproducing apparatus using a mono speaker according to another embodiment of the present general inventive concept.

FIG. 2B illustrates an expanded sound reproducing apparatus using a mono speaker according to another embodiment of the present general inventive concept.

Referring to FIG. 2B, the sound reproducing apparatus in the present embodiment is distinguished from the previous embodiment in that the sound reproducing apparatus of FIG. 2B further includes a speaker equalizer 270 to maximize the characteristic of a monaural HRTF.

In other words, the speaker equalizer 270 planarizes the frequency characteristic of the signals output from the second adding unit 250. For example, the speaker equalizer 270 can include a high-pass filter to remove low frequency band signals and a band-pass filter compensating for the mid and high band frequency characteristics of the signal output from the second adding unit 250.

Figure 3:
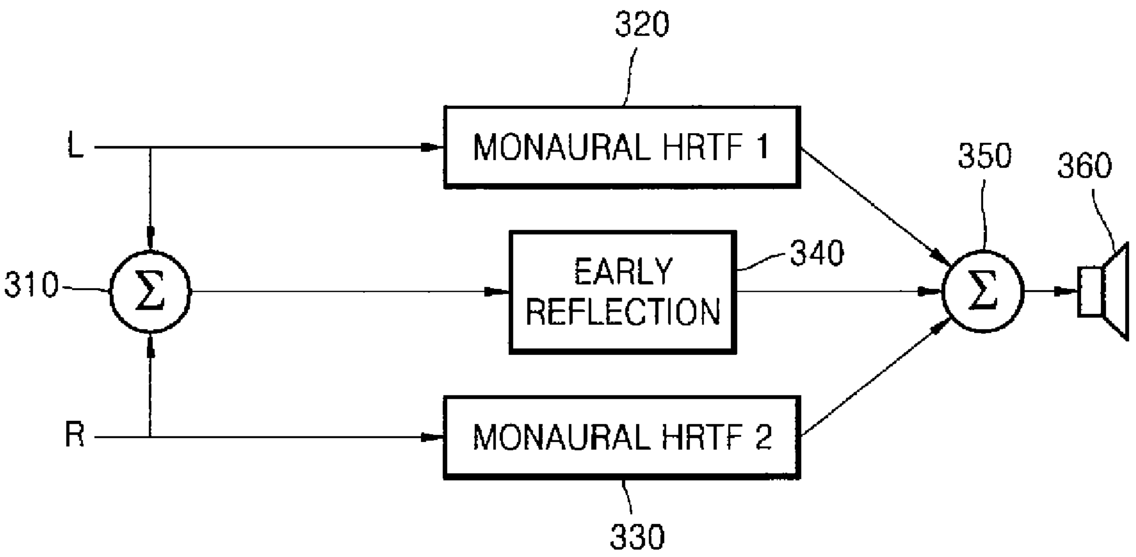
FIG. 3 illustrates an expanded sound reproducing apparatus using a mono speaker according to another embodiment of the present general inventive concept.

FIG. 3 illustrates an expanded sound reproducing apparatus using a mono speaker according to another embodiment of the present general inventive concept. Referring to FIG. 3, a first adding unit 310 adds signals of the left channel L and the right channel R. A sound field filter unit 340 adds an early reflection sound in order to give a horizontal expansion effect to the signal output by the first adding unit 310. A first convolution unit 320 convolves the signal of the left channel with a first monaural HRTF 1. A second convolution unit 330 convolves the signal of the right channel R with a second HRTF 2. A second adding unit 350 adds the signals output from the sound field unit 340 and from the first and second convolution units 320 and 340 and outputs them to a mono speaker 360.

Figure 4:
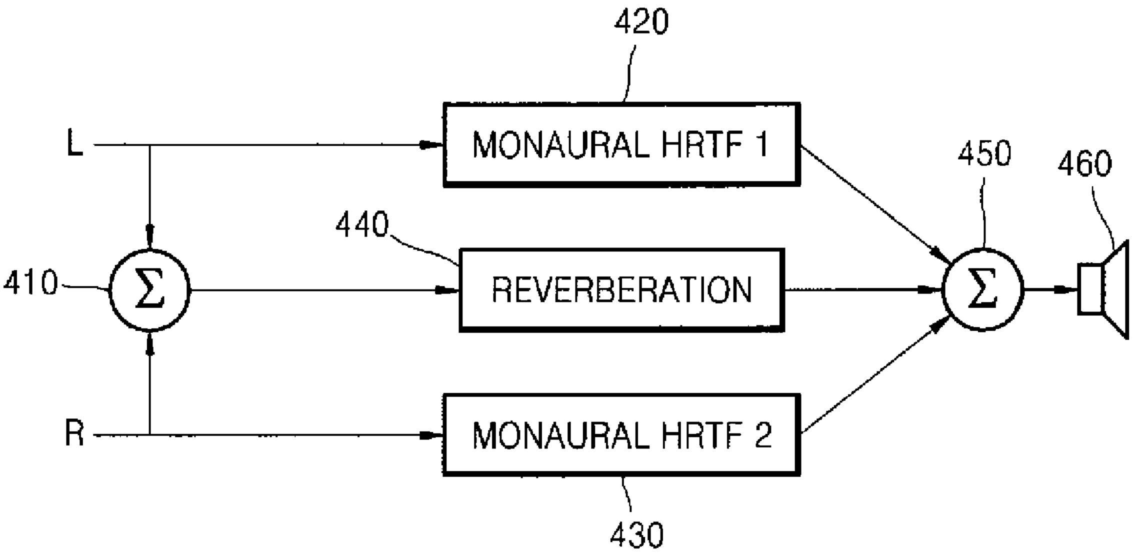
FIG. 4 illustrates an expanded sound reproducing apparatus using a mono speaker according to another embodiment of the present general inventive concept.

FIG. 4 illustrates an expanded sound reproducing apparatus using a mono speaker according to another embodiment of the present general inventive concept. Referring to FIG. 4, a first adding unit 410 adds signals of the left channel L and the right channel R. A sound field filter unit 440 adds a reverberation sound in order to give horizontal expansion effect to the signal output by the first adding unit 410. A first convolution unit 420 convolves the signal of the left channel with a first monaural HRTF 1. A second convolution unit 430 convolves the signal of the right channel with a second monaural HRTF 2. A second adding unit 450 adds the signals output from the sound field unit 440 and the signals output from the first and second convolution units 420 and 440 and outputs them to a mono speaker 460.

Figure 5:
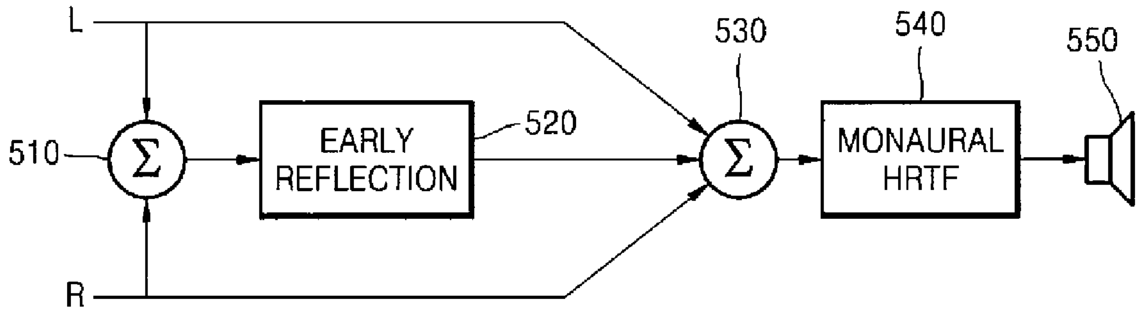
FIG. 5 illustrates an expanded sound reproducing apparatus using a mono speaker according to another embodiment of the present general inventive concept.

FIG. 5 illustrates an expanded sound reproducing apparatus using a mono speaker according to another embodiment of the present general inventive concept. A first adding unit 510 adds signals of the left channel L and the right channel R. A sound field filter unit 520 adds an early reflection sound to give a horizontal expansion effect to the signal output by the first adding unit 510. A second adding unit 530 adds the signal output from the sound field filter unit 520 and the left channel L signal and the right channel R signal. A convolution unit 540 convolves the signal output by the second adding unit 530 with a monaural HRTF and outputs it to a mono speaker 550.

Figure 6:
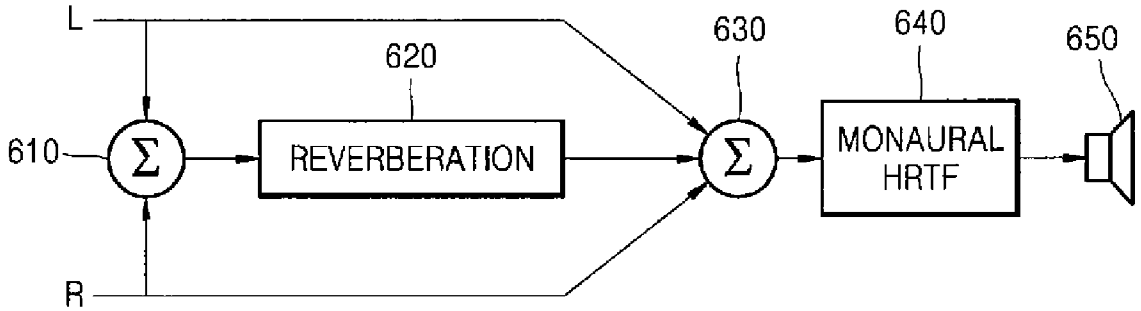
FIG. 6 illustrates an expanded sound reproducing apparatus using a mono speaker according to another embodiment of the present general inventive concept.

FIG. 6 illustrates an expanded sound reproducing apparatus using a mono speaker according to another embodiment of the present general inventive concept. A first adding unit 610 adds signals of the left channel L and the right channel R. A sound field filter unit 620 adds a reverberation sound in order to give horizontal expansion effect to the signals output by the first adding unit 610. A second adding unit 630 adds the signals output from the sound field filter unit 620 and the signals of the left channel L and the right channel R. A convolution unit 640 convolves the signals added by the second adding unit 630 with a monaural HRTF and outputs them to a mono speaker 650.

Figure 7:
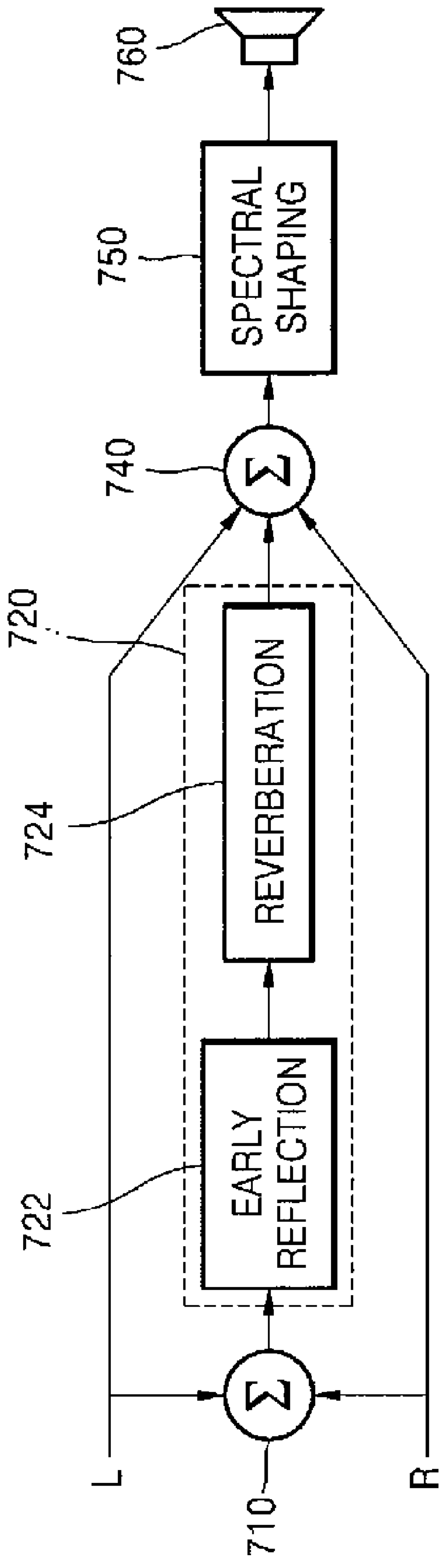
FIG. 7 illustrates an expanded sound reproducing apparatus using a mono speaker according to another embodiment of the present general inventive concept.

FIG. 7 illustrates an expanded sound reproducing apparatus using a mono speaker according to another embodiment of the present general inventive concept. A first adding unit 710 adds signals of the left channel L and the right channel R. A sound field filter unit 720 adds an early reflection sound 722 and a reverberation sound 724 to the signals output by the first adding unit 710 in order to give horizontal expansion effect to the signals output by the first adding unit 710. A second adding unit 740 adds the signals output from the sound field filter unit 720 and the signals of the left channel L and the right channel R. A spectral shaping unit 750 changes the frequency characteristic of the signals added by the second adding unit 740 and outputs them to a mono speaker 760. That is, the spectral shaping unit 750 includes a monaural HRTF and a speaker equalizer to convolve the added signals with the monaural HRTF and compensate for the speaker frequency characteristic of the mono speaker.

The present general inventive concept can also be embodied as computer-readable codes on a computer-readable medium. The computer-readable medium can include a computer-readable recording medium and a computer-readable transmission medium. The computer-readable recording medium is any data storage device that can store data which can be thereafter read by a computer system. Examples of the computer-readable recording media include read-only memory (ROM), random-access memory (RAM), CD-ROMs, magnetic tapes, floppy disks, optical data storage devices. The computer-readable recording medium can also be distributed over network-coupled computer systems so that the computer-readable code is stored and executed in a distributed fashion. The computer-readable transmission medium can transmit carrier waves and signals (e.g., wired or wireless data transmission through the Internet). Also, functional programs, codes, and code segments to accomplish the present general inventive concept can be easily construed by programmers skilled in the art to which the present general inventive concept pertains.

As described above, according to the various embodiments of the present general inventive concept, when a stereo sound signal or a mono sound signal is reproduced with a mono speaker, a virtual speaker is generated using a HRTF in upper and lower directions and an early reverberation sound is generated in right and left directions, and thus a diffused sound can also be experienced with respect to a small mono speaker. When a stereo input or a mono input is reproduced using products (e.g., PDA, PMP, DMB, cellular phones, etc.) in which a mono speaker is employed, the stereo sound stage is broadened and thus the audience can sense an improved stereo effect.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of reproducing an input stereo signal or an input mono signal as an expanded sound using a mono speaker, the method comprising:

adding a first channel signal and a second channel signal;

sound field filtering by adding a sound field effect to the added channel signals;

convolving the signal of the first channel with a first HRTF in a first convolution process;

convolving the signal of the second channel with a second HRTF in a second convolution process;

adding the signal output from the sound field filtering and the signals output from the first and second convolution processes to produce an output signal; and delivering the output signal to the mono speaker to generate the expanded sound.

2. The method of claim 1, further comprising:

compensating for a frequency characteristic of the mono speaker with respect to the output signal.

3. The method of claim 1, wherein the first HRTF is a monaural HRTF at an upper angle.

4. The method of claim 1, wherein the second HRTF is a monaural HRTF at a lower angle.

5. The method of claim 1, wherein the sound field filtering comprises:

generating the added signals as an early reflection sound through a tapped delay line; and adding a reverberation to the early reflection sound.

6. The method of claim 5, wherein the early reflection sound is formed of finite impulse filter coefficients.

7. The method of claim 1, wherein the sound field filtering comprises generating the added signals as an early reflection sound.

8. The method of claim 1, wherein the sound field filtering comprises generating the added signals as a reverberation sound.

9. The method of claim 1, further comprising substituting a similar input mono signal to the first and second channels when an input signal is a mono signal.

10. A method of reproducing an input stereo signal or an input mono signal as an expanded sound using a mono speaker, the method comprising:
- adding a first channel signal and a second channel signal;
- sound field filtering by adding a sound field effect to the added channel signals;
- convolving the signal of the first channel with a first HRTF in a first convolution process;
- convolving the signal of the second channel with a second HRTF in a second convolution process;
- adding the signal output from the sound field filtering and the signals output from the first and second convolution processes to produce an output signal; and
- spectral changing a frequency characteristic of the output signal; and
- delivering the output signal to the mono speaker to generate the expanded sound.

11. The method of claim 10, wherein the spectral changing removes a low band characteristic of the output signal and compensates for the mid and high band characteristics of the output signal.

12. A method of reproducing an input stereo signal or an input mono signal as an expanded sound using a mono speaker, the method comprising:
- adding a first channel signal and a second channel signal;
- sound field filtering by adding a sound field effect to the added channel signals;
- adding the signal output from the sound field filtering and the signals of the first and second channels to produce an output signal; and
- spectral shaping by changing a frequency characteristic of the output signal; and
- delivering the output signal to the mono speaker to generate the expanded sound.

13. A method of reproducing an input stereo signal or an input mono signal as an expanded sound using a mono speaker, the method comprising:
- adding a first channel signal and a second channel signal;
- providing a horizontal expansion effect to the added first and second channel signals;
- providing a vertical expansion effect to each of the first and second channel signals;
- adding the signals having the horizontal expansion effect and the vertical expansion effect to provide signals vertically and horizontally expanded; and
- delivering the vertically and horizontally expanded signals to the mono speaker to generate the expanded sound.

14. The method of claim 13, further comprising:
- planarizing the frequency characteristics of the vertically and horizontally expanded signals.

15. The method of claim 14, wherein the planarizing comprises removing low frequency band signals and compensating for mid and high band frequency characteristics of the vertically and horizontally expanded signals.

16. A sound reproducing apparatus to reproduce an input stereo signal or an input mono signal as an expanded sound using a mono speaker, the apparatus comprising:
- a first adding unit to add signals of first and second channels;
- a sound field filter unit to apply a sound field effect with respect to the added signals of the first adding unit;
- a first convolution unit to convolve the signal of the first channel with a first monaural HRTF;
- a second convolution unit to convolve the signal of the second channel with a second monaural HRTF;
- a second adding unit to add the signal output from the sound field filter unit and the signals output from the first and second convolution units to produce an output signal; and
- a spectral shaping unit to change a frequency characteristic of the output signal.

17. The apparatus of claim 16, wherein the spectral shaping unit comprises:
- a convolution unit to convolve the output signal with a monaural HRTF; and
- a speaker equalizer to compensate for a frequency characteristic of the speaker with respect to the convolved signal.

18. The apparatus of claim 16, wherein the speaker equalizer comprises:
- a high-pass filter to remove a low frequency component of the convolved signal; and
- a band-pass filter to compensate for the mid and high band frequency characteristics of the convolved signal.

19. A sound reproducing apparatus to reproduce an input stereo signal or an input mono signal as an expanded sound using a mono speaker, the apparatus comprising:
- an expanded sound reproducing apparatus to apply monaural HRTFs at upper and lower angles to input signals, respectively, to diffuse the source width in upper and lower directions and to apply an early reflection sound and a reverberation sound to diffuse the source width in right and left directions to at least one added input signal; and
- a speaker equalizer to compensate for the frequency characteristic of the speaker with respect to a signal expanded by the sound reproducing apparatus.

20. A sound reproducing apparatus to reproduce an input stereo signal or an input mono signal as an expanded sound using a mono speaker, the apparatus comprising:
- a first adding unit to add signals of first and second channels;
- a sound field filter unit to apply a sound field effect with respect to the added signals of the first adding unit;
- a convolution device to convolve the first channels signals with a first monaural HRTF and the second channel signals with a second monaural HRTF; and
- a second adding unit to add the signal output from the sound field filter unit and the convolved first and second channel signals output from the convolution device to produce an output signal.

21. A non-transitory recordable medium containing a method of reproducing an input stereo signal or an input mono signal as an expanded sound using a mono speaker executed by a control module, the method comprising:
- adding a first channel signal and a second channel signal;
- sound field filtering by adding a sound field effect to the added channel signals;
- convolving the signal of the first channel with a first HRTF in a first convolution process;
- convolving the signal of the second channel with a second HRTF in a second convolution process; and
- adding the signal output from the sound field filtering and the signals output from the first and second convolution processes to produce an output signal.

* * * * *